(12) United States Patent
Matsumura

(10) Patent No.: US 6,890,702 B2
(45) Date of Patent: May 10, 2005

(54) LIGHT SENSITIVE COMPOSITION AND LIGHT SENSITIVE PLANOGRAPHIC PRINTING PLATE PRECURSOR

(75) Inventor: Toshiyuki Matsumura, Fujino-machi (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 10/606,707

(22) Filed: Jun. 25, 2003

(65) Prior Publication Data

US 2004/0048189 A1 Mar. 11, 2004

(30) Foreign Application Priority Data

Jul. 2, 2002 (JP) ........................................ 2002-193272

(51) Int. Cl.$^7$ .......................... G03F 7/028; G03F 7/032
(52) U.S. Cl. ............................... 430/284.1; 430/281.1; 430/286.1; 430/302
(58) Field of Search ........................... 430/281.1, 283.1, 430/284.1, 286.1, 287.1, 288.1, 302

(56) References Cited

U.S. PATENT DOCUMENTS 6,475,700 B1 * 11/2002 Higashi et al. .......... 430/278.1
2004/0091816 A1 * 5/2004 Matsumura et al. ..... 430/281.1

FOREIGN PATENT DOCUMENTS

| EP | 0 184 725 A2 | 6/1986 | | |
|---|---|---|---|---|
| EP | 602 292 A1 * | 6/1994 | ........... | G03F/7/027 |
| EP | 0 624 825 A2 | 11/1994 | | |
| EP | 1 096 314 A1 * | 5/2001 | ........... | G03F/7/027 |

OTHER PUBLICATIONS

Chemical Abstracts, vol. 102, No. 4, Jan. 28, 1985, Columbus, Ohio, US; abstract No. 36783, "Photosensitive composition" XP002257099 of JP 59 111638 A, (Toyo Rubber Industry Co., Ltd.) Apr. 27, 1984.
Database WPI, Section Ch, Week 200257, Derwent Publications Ltd., London, GB; AN 2002–531980, XP002257100 of JP 2002 128857 A (Nippon Kayaku KK), May 9, 2002.
Patent Abstracts of Japan, vol. 018, No. 362 (P–1766) Jul. 7, 1994 of JP 06 095383 A (Konica Corp), Apr. 8, 1994.

* cited by examiner

*Primary Examiner*—Barbara L. Gilliam
(74) *Attorney, Agent, or Firm*—Frishauf, Holtz, Goodman & Chick, P.C.

(57) ABSTRACT

Disclosed are a light sensitive composition containing A) an addition polymerizable ethylenically double bond-containing monomer, B) a photopolymerization initiator, and C) a polymer binder, wherein the addition polymerizable ethylenically double bond-containing monomer is a reaction product of a tertiary amine having two or more hydroxyl groups in the molecule, a diisocyanate having an aromatic ring in the molecule and a compound having a hydroxyl group and an addition polymerizable ethylenically double bond in the molecule, and a light sensitive planographic printing plate precursor comprising the light sensitive composition.

12 Claims, No Drawings

US 6,890,702 B2

LIGHT SENSITIVE COMPOSITION AND LIGHT SENSITIVE PLANOGRAPHIC PRINTING PLATE PRECURSOR

FIELD OF THE INVENTION

The present invention relates to a light sensitive composition and a light sensitive planographic printing plate precursor, and particularly to a light sensitive composition and a light sensitive planographic printing plate precursor, each providing high sensitivity, high storage stability, and high printing durability.

BACKGROUND OF THE INVENTION

A planographic printing plate is obtained by imagewise exposing a planographic printing plate precursor to harden exposed portions, dissolving the non-exposed portions of the exposed precursor with a developer, washing the resulting precursor with water, and finisher gum treating the washed precursor. Recently, a method has been studied in which a planographic printing plate precursor is digitally exposed based on image information employing laser ray, and developed with a developer to form an image with high resolution and high sharpness. As one embodiment, there is a system manufacturing a planographic printing plate in which a light sensitive planographic printing plate precursor is scanning exposed employing a light source modulated with an image signal transmitted by communication line or output signal from an electronic plate making system or an image processing system.

However, a conventional planographic printing plate precursor employing a diazo resin has problem in that spectral sensitization to suit a wavelength of laser ray and obtain high sensitivity is difficult.

Recently, a planographic printing plate precursor comprising a photopolymerizable light sensitive layer containing a photopolymerization initiator has been noted as a printing plate precursor for digital exposure employing a laser light, since it is possible to provide a photopolymerizable light sensitive layer highly sensitive to the laser light. A printing plate precursor for CTP (Computer to Plate) system recording digital data employing such a laser light is required to be more highly light-sensitive for the purpose of carrying out recording in a short time.

The planographic printing plate precursor is said to be suitable for forming an image with high sensitivity which comprises a photopolymerizable light sensitive layer containing a photopolymerization initiator, since the photopolymerization initiator imagewise generates radicals on imagewise exposure, and the resulting radicals cause radical chain polymerization as radical initiating species.

In order to attain high sensitivity, various methods have been so far proposed. For example, a method is proposed in Japanese Patent O.P.I. Publication Nos. 63-277653, 63-260909, 1-105238, and 1-203413 in which a tertiary amino group is incorporated in a monomer (an addition polymerizable ethylenically unsaturated monomer). However, methods proposed so far do not provide satisfactory sensitivity or printing durability, and has problem in that when a light sensitive planographic printing plate precursor employing these methods is stored for a long time, its sensitivity is lowered.

SUMMARY OF THE INVENTION

The present invention has been made in view of the above. An object of the invention is to provide a light sensitive composition and a light sensitive planographic printing plate precursor, each providing high sensitivity, high storage stability, and high printing durability.

DETAILED EXPLANATION OF THE INVENTION

The above objects of the invention can be attained by the followings:

1-1. A light sensitive composition containing A) an addition polymerizable ethylenically double bond-containing monomer, B) a photopolymerization initiator, and C) a polymer binder, wherein the addition polymerizable ethylenically double bond-containing monomer is a reaction product of a tertiary amine having two or more hydroxyl groups in the molecule, a diisocyanate having an aromatic ring in the molecule and a compound having a hydroxyl group and an addition polymerizable ethylenically double bond in the molecule.

1-2. The light sensitive composition of item 1-1 above, wherein the photopolymerization initiator is a polyhalogenated methyl group-containing triazine compound.

1-3. The light sensitive composition of item 1-1 above, wherein the tertiary amine has a hydroxyl group of from 2 to 6 in the molecule.

1-4. The light sensitive composition of item 1-1 above, wherein the polymer binder is a copolymer of a carboxyl group-containing monomer and an alkyl methacrylate or alkyl acrylate.

1-5. The light sensitive composition of item 1-4 above, wherein the carboxyl group-containing monomer is acrylic acid or methacrylic acid.

1-6. A light sensitive planographic printing plate precursor comprising a support and provided thereon, a photopolymerizable light sensitive layer containing A) an addition polymerizable ethylenically double bond-containing monomer, B) a photopolymerization initiator, and C) a polymer binder, wherein the addition polymerizable ethylenically double bond-containing monomer is a reaction product of a tertiary amine having two or more hydroxyl groups in the molecule, a diisocyanate having an aromatic ring in the molecule and a compound having a hydroxyl group and an addition polymerizable ethylenically double bond in the molecule.

1-7. The light sensitive planographic printing plate precursor of item 1-6 above, wherein the photopolymerization initiator is a polyhalogenated methyl group-containing triazine compound.

1-8. The light sensitive planographic printing plate precursor of item 1-6 above, wherein the tertiary amine has a hydroxyl group of from 2 to 6 in the molecule.

1-9. The light sensitive planographic printing plate precursor of item 1-6 above, wherein the polymer binder is a copolymer of a carboxyl group-containing monomer and an alkyl methacrylate or alkyl acrylate.

1-10. The light sensitive planographic printing plate precursor of item 1-9 above, wherein the carboxyl group-containing monomer is acrylic acid or methacrylic acid.

2-1. A light sensitive composition containing A) an addition polymerizable ethylenically double bond-containing monomer, B) a photopolymerization initiator, and C) a polymer binder, wherein the addition polymerizable ethylenically double bond-containing monomer is a reaction product of a polyhydric alcohol having a tertiary amino group in the molecule, an aromatic diisocyanate and a compound having a hydroxyl group and an addition polymerizable ethylenically double bond in the molecule.

2-2. The light sensitive composition of item 2-1 above, containing a triazine having a polyhalogenated methyl group.

2-3. A planographic printing plate precursor comprising a support and provided thereon, a layer containing A) an addition polymerizable ethylenically double bond-containing monomer, B) a photopolymerization initiator, and C) a polymer binder, wherein the addition polymerizable ethylenically double bond-containing monomer is a reaction product of a polyhydric alcohol having a tertiary amino group in the molecule, an aromatic diisocyanate and a compound having a hydroxyl group and an addition polymerizable ethylenically double bond in the molecule.

2-4. The planographic printing plate precursor of item 2-3 above, wherein the layer contains a triazine having a polyhalogenated methyl group.

The present inventor has made an extensive study in view of the above. As a result, the inventor has found that a light sensitive composition provides high sensitivity which contains A) an addition polymerizable ethylenically double bond-containing monomer, B) a photopolymerization initiator, and C) a polymer binder, wherein the addition polymerizable ethylenically double bond-containing monomer is a reaction product of a tertiary amine having two or more hydroxyl groups in the molecule, a diisocyanate having an aromatic ring in the molecule and a compound having a hydroxyl group and an addition polymerizable ethylenically double bond in the molecule, and a planographic printing plate precursor comprising the light sensitive composition provide high storage stability regarding sensitivity, and high printing durability, and has completed the invention.

The light sensitive composition of the invention will be explained below.

The light sensitive composition of the invention contains, as main components, A) a reaction product of a tertiary amine having two or more hydroxyl groups in the molecule, a diisocyanate having an aromatic ring in the molecule, and a compound having a hydroxyl group and an addition polymerizable ethylenically double bond in the molecule as an addition polymerizable ethylenically double bond-containing monomer, B) a photopolymerization initiator, and C) a polymer binder.

The addition polymerizable ethylenically double bond-containing monomer will be explained below. The addition polymerizable ethylenically double bond-containing monomer (hereinafter also referred to as the addition polymerizable ethylenically double bond-containing monomer in the invention) is a reaction product of a tertiary amine having two or more hydroxyl groups in the molecule, a diisocyanate having an aromatic ring in the molecule and a compound having a hydroxyl group and an addition polymerizable ethylenically double bond in the molecule The tertiary amine having two or more hydroxyl groups in the molecule has a hydroxyl group of preferably from 2 to 6, and more preferably from 2 to 4. Examples of the tertiary amine having two or more hydroxyl groups in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N',N'-tetra-2-hydroxypropylethylenediamine, p-tolyldiethanolamine, N,N, N', N'-tetra-2-hydroxyethylethylenediamine, N,N-bis(2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate having an aromatic ring in the molecule include 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-(diisocyanatomethyl)benzene, 4,4'-(diisocyanatomethyl)biphenyl, 1,3-bis(1-isocyanato-1-methyl-ethyl)benzene, and di(4-isocyanatophenyl)methane, but the invention is not specifically limited thereto.

Examples of the compound having a hydroxyl group and an addition polymerizable ethylenically double bond in the molecule include the following compounds MH-1 through MH-13, but the invention is not specifically limited thereto.

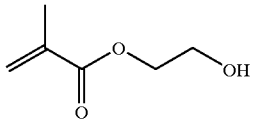

MH-1

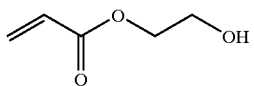

MH-2

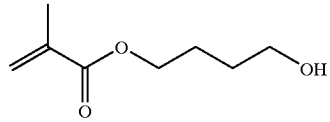

MH-3

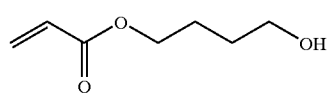

MH-4

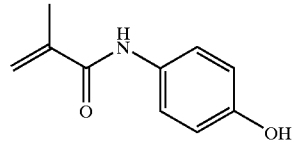

MH-5

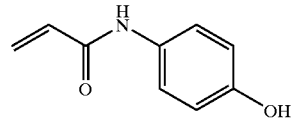

MH-6

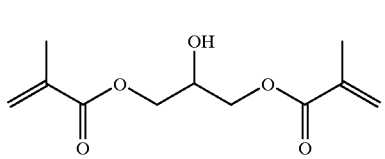

MH-7

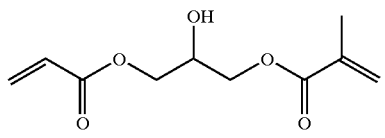

MH-8

-continued

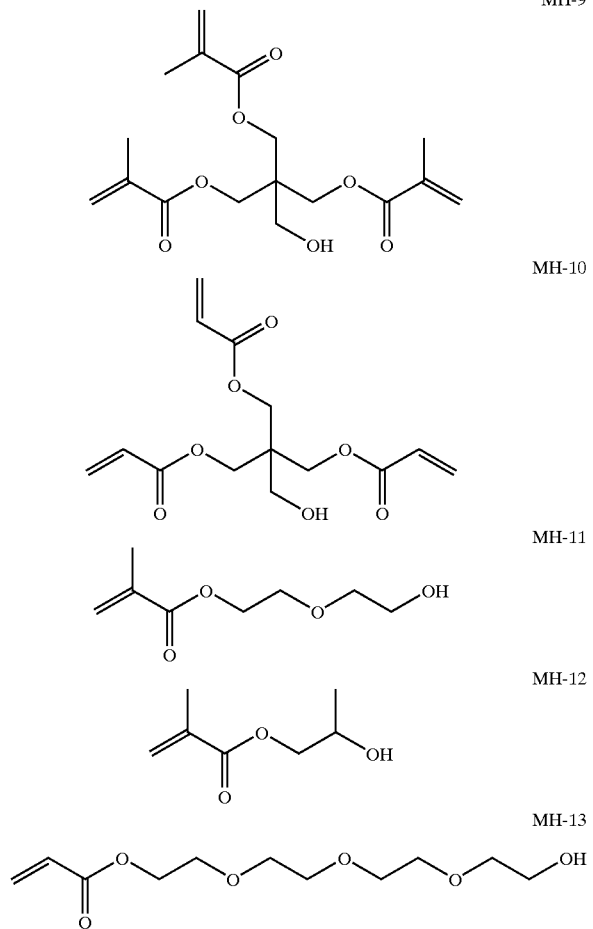

The reaction product of a tertiary amine having two or more hydroxyl groups in the molecule, a diisocyanate having an aromatic ring in the molecule and a compound having a hydroxyl group and an addition polymerizable ethylenically double bond in the molecule, can be synthesized according to the same method as a conventional method in which a urethaneacrylate compound is ordinarily synthesized employing a diol, a diisocyanate and an acrylate having a hydroxyl group.

Examples of the reaction product of a tertiary amine having two or more hydroxyl groups in the molecule, a diisocyanate having an aromatic ring in the molecule and a compound having a hydroxyl group and an addition polymerizable ethylenically double bond in the molecule will be listed below, but the invention is not specifically limited thereto.

M-1: A reaction product of triethanolamine (1 mole), 1,4-phenylene diisocyanate (3 moles), and Exemplified Compound MH-1 (3 moles)

M-2: A reaction product of triethanolamine (1 mole), tolylene-2,4-diisocyanate (3 moles), and Exemplified Compound MH-2 (3 moles)

M-3: A reaction product of N-ethyldiethanolamine (1 mole), tolylene-2,4-diisocyanate (2 moles), and Exemplified Compound MH-2 (2 moles)

M-4: A reaction product of triethanolamine (1 mole), tolylene-2,4-diisocyanate (2 moles), and Exemplified Compound MH-8 (2 moles)

M-5: A reaction product of N-n-butyldiethanolamine (1 mole), 1,4-phenylene diisocyanate (2 moles), and Exemplified Compound MH-7 (2 moles)

M-6: A reaction product of tolyldiethanolamine (1 mole), tolylene-2,4-diisocyanate (2 moles), and Exemplified Compound MH-11 (2 moles)

M-7: A reaction product of 3-diethylamino-1,2-propanediol (1 mole), tolylene-2,4-diisocyanate (2 moles), and Exemplified Compound MH-12 (2 moles)

The content of the addition polymerizable ethylenically double bond-containing monomer in the invention in the light sensitive composition is from 3 to 80% by weight, and preferably from 5 to 60% by weight based on the solid components of the composition.

The addition polymerizable ethylenically double bond-containing monomer in the invention may be mixed with other addition polymerizable ethylenically double bond-containing monomers. The other addition polymerizable ethylenically double bond-containing monomers are not specifically limited, but preferred examples thereof include an acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxy-hexanorideacrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ε-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. This prepolymer can be used singly, as an admixture of the above described monomers and/or oligomers.

Examples of the prepolymer include polyester (meth)acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth)acrylic acid in an epoxy resin; an urethaneacrylate such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadieneglycol.tolylenediisocyanate.-2-hydroxyethylacrylate or trimethylolpropane.propylene glycol.tolylenediisocyanate. 2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

The light sensitive composition of the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenic monomer usable in the invention is preferably a phosphate compound having at least one (meth) acryloyl group. The phosphate compound is a compound having a (meth)acryloyl group in which at least one hydroxyl group of phosphoric acid is esterified, and the phosphate compound is not limited as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV.EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

The content of the other addition polymerizable ethylenically double bond-containing monomer optionally mixed with the addition polymerizable ethylenically double bond-containing monomer in the invention in the light sensitive composition is not more than 20 times, and preferably not more than 10 times that of the addition polymerizable ethylenically double bond-containing monomer in the invention.

A photopolymerization initiator will be explained below.

The photopolymerization initiators capable of being used in the invention include carbonyl compounds, organic sulfur compounds, peroxides, redox compounds, azo or diazo compounds, halides and photo-reducing dyes disclosed in J. Kosar, "Light Sensitive Systems", Paragraph 5. The examples thereof are disclosed in British Patent No. 1,459,563.

Examples of the photopolymerization initiators include the following compounds:

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis (dimethylamino) benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85-277 (1988) and Japanese Patent O.P.I. Publication No. 2-182701; 2,4,5-triarylimidazol dimmer disclosed in Japanese Patent O.P.I. Publication No. 3-209477; carbon tetrabromide; organic halide compounds disclosed in Japanese Patent O.P.I. Publication No. 59-107344; triarylmonoalkylborate ammonium salts; and iron-arene complexes.

Preferred photopolymerization initiator is a titanocene compound. Examples of the titanocene compound include di-cyclopentadienyl-Ti-dichloride, dicyclopentadienyl-Ti-bisphenyl, dicyclopentadienyl-Ti-bis-2,3,4,5,6-pentafluorophenyl, dicyclopentadienyl-Ti-bis-2,3,5,6-tetrafluorophenyl, dicyclopentadienyl-Ti-bis-2,4,6-trifluorophenyl, dicyclopentadienyl-Ti-bis-2,6-difluorophenyl, dicyclopentadienyl-Ti-bis-2,4-difluorophenyl, di-methylcyclopentadienyl-Ti-bis-2,3,4,5,6-pentafluorophenyl, di-methylcyclopentadienyl-Ti-bis-2,3,5, 6-tetrafluorophenyl, di-methylcyclopentadienyl-Ti-bis-2,4-difluorophenyl, and bis (cyclopentadienyl)-bis (2,6-difluoro-3-(pyrryl)phenyl)titanium (IRUGACURE 784, produced by Ciba Specialty Co., Ltd.), but are not limited thereto.

In the invention, especially preferred photopolymerization initiator is a polyhalogenated methyl group-containing triazine compound.

As the polyhalogenated methyl group-containing triazine compound is preferred a 1,3,5-triazine having a trichloromethyl group or a dichloromethyl group at least one thereof.

Examples of the polyhalogenated methyl group-containing triazine compound will be listed below, but the invention is not specifically limited thereto.

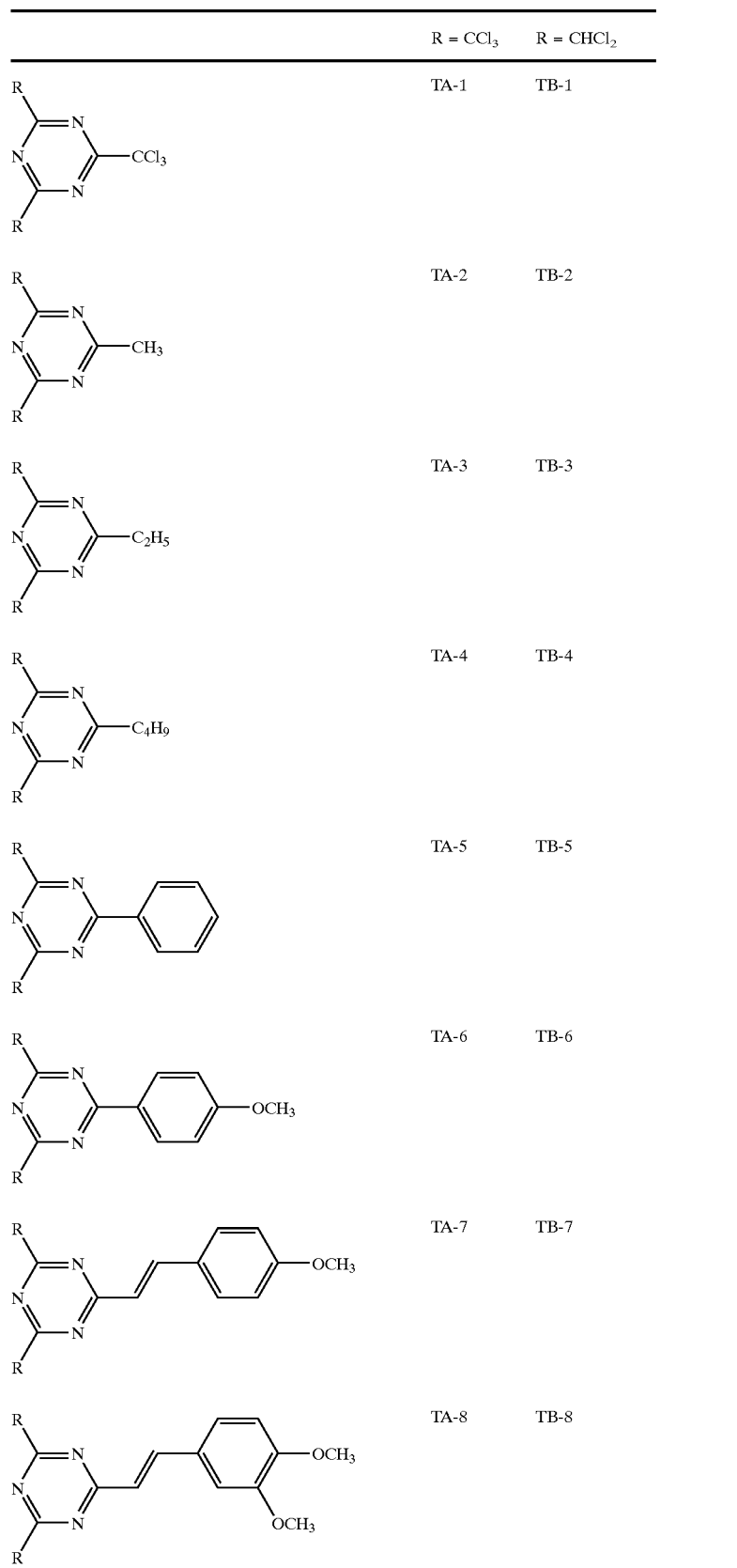
|  | R = CCl₃ | R = CHCl₂ |
|---|---|---|
|  | TA-1 | TB-1 |
|  | TA-2 | TB-2 |
|  | TA-3 | TB-3 |
|  | TA-4 | TB-4 |
|  | TA-5 | TB-5 |
|  | TA-6 | TB-6 |
|  | TA-7 | TB-7 |
|  | TA-8 | TB-8 |

-continued
| | R = CCl₃ | R = CHCl₂ |
|---|---|---|
| 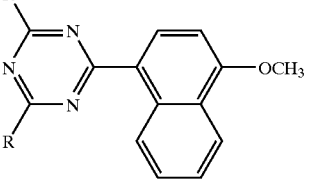 | TA-9 | TB-9 |
| 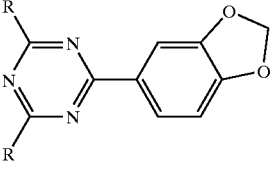 | TA-10 | TB-10 |
| 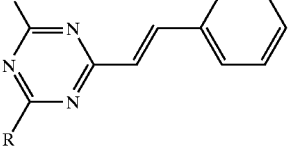 | TA-11 | TB-11 |
| 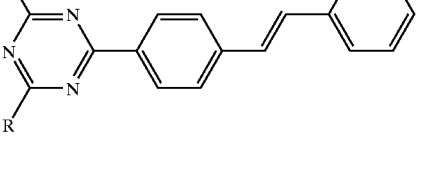 | TA-12 | TB-12 |
| 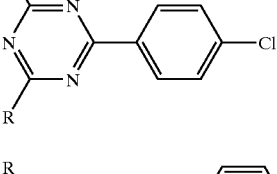 | TA-13 | TB-13 |
| 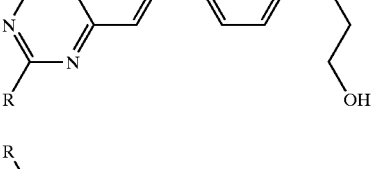 | TA-14 | TB-14 |
| 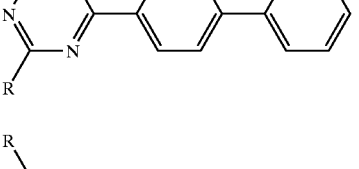 | TA-15 | TB-15 |
| 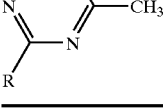 | TA-16 | TB-16 |

When a laser is employed as a light source, the light sensitive composition of the invention preferably contains a sensitizing dye. The sensitizing dye is preferably a dye having an absorption maximum in the wavelength of light emitted from the light source or its vicinity.

Examples of the sensitizing dyes, which can induce sensitivity to the wavelengths of visible to near infrared regions, include cyanines, phthalocyanines, merocyanines, porphyrins, Spiro compounds, ferrocenes, fluorenes, fulgides, imidazoles, perylenes, phenazines, phenothiazines, polyenes, azo compounds, diphenylmethanes, triphenylmethanes, polymethine acridines, cumarines, ketocumarines, quinacridones, indigos, styryl dyes, pyrylium dyes, pyrromethene dyes, pyrazolotriazole compounds, benzothiazole compounds, barbituric acid derivatives, thiobarbituric acid derivatives, ketoalcohol borate complexes, and compounds disclosed in European Patent No. 568,993, U.S. Pat. Nos. 4,508,811 and 5,227,227, and Japanese Patent O.P.I. Publication Nos. 2001-125255 and 11-271969.

Examples in which the above polymerization initiators are used in combination with the sensitizing dye are disclosed in Japanese Patent O.P.I. Publication Nos. 2001-125255 and 11-271969.

The content of the photopolymerization initiator is not specifically limited but is preferably from 0.1 to 20 parts by weight based on 100 parts by weight of addition polymerizable ethylenically double bond-containing monomer in the light sensitive composition. The content ration of the sensitizing dye to the photopolymerization initiator in the light sensitive composition is preferably from 1:100 to 100:1 by mol.

The light sensitive composition of the invention contains a polymer binder.

As the polymer binder can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

The polymer binder used in the invention is preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl) acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl)methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl)heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer. As the polymer binder is also preferred an unsaturated bond-containing copolymer which is obtained by reacting a carboxyl group contained in the above vinyl copolymer molecule with for example, a compound having a (meth)acryloyl group and an epoxy group. Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC), but is not limited thereto.

The content of the polymer binder in the light sensitive composition is preferably from 10 to 90% by weight, more preferably from 15 to 70% by weight, and still more preferably from 20 to 50% by weight, based on the solid content of the light sensitive composition, in view of sensitivity.

The acid value of the polymer binder is preferably from 10 to 150, more preferably from 30 to 120, and still more preferably from 50 to 90, in view of balance of polarity of the photopolymerizable light sensitive layer, which can prevent coagulation of pigment used in the photopolymerizable light sensitive layer coating liquid.

The dry thickness of the photopolymerizable light sensitive layer is preferably 0.3 to 5 g/m$^2$, and more preferably 0.5 to 3 g/m$^2$.

The light sensitive composition of the invention preferably contains a polymerization inhibitor in addition to the compounds described above, in order to prevent undesired polymerization of the ethylenically double bond-containing monomer during the manufacture or storage of a light sensitive planographic printing plate employing the composition. Examples of the polymerization inhibitor include hydroquinone, p-methoxyphenol, di-t-butyl-p-cresol, pyrrogallol, t-butylcatechol, benzoquinone, 4,4'-thiobis (3-methyl-6-t-butylphenol), 2,2'-methylenebis (4-methyl-6-t-butylphenol), N-nitrosophenylhydroxylamine cerous salt, and 2-t-butyl-6-(3-t-butyl-6-hydroxy-5-mrthylbenzyl)-4-methylphenyl acrylate.

The polymerization inhibitor content is preferably 0.01 to 5% by weight based on the total solid content of the photopolymerizable light sensitive layer composition. Further, in order to prevent polymerization induced by oxygen, a higher fatty acid such as behenic acid or a higher fatty acid derivative such as behenic amide may be added to the layer, or may be localized on the surface of the layer in the drying step after coating. The higher fatty acid or higher fatty acid derivative content is preferably 0.5 to 10% by weight based on the total solid content of the photopolymerizable light sensitive layer composition.

A colorant can be also used. As the colorant can be used known materials including commercially available materials. Examples of the colorant include those described in revised edition "Ganryo Binran", edited by Nippon Ganryo Gijutu Kyoukai (publishe by Seibunndou Sinkosha), or "Color Index Binran".

Kinds of the pigment include black pigment, yellow pigment, red pigment, brown pigment, violet pigment, blue pigment, green pigment, fluorescent pigment, and metal powder pigment. Examples of the pigment include inorganic pigment (such as titanium dioxide, carbon black, graphite, zinc oxide, Prussian blue, cadmium sulfide, iron oxide, or chromate of lead, zinc, barium or calcium); and organic pigment (such as azo pigment, thioindigo pigment, anthraquinone pigment, anthanthrone pigment, triphenedioxazine pigment, vat dye pigment, phthalocyanine pigment or its derivative, or quinacridone pigment).

Among these pigment, pigment is preferably used which does not substantially have absorption in the absorption wavelength regions of a spectral sensitizing dye used according to a laser for exposure. The absorption of the pigment used is not more than 0.05, obtained from the reflection spectrum of the pigment measured employing an integrating sphere and employing light with the wavelength of the laser used. The pigment content is preferably 0.1 to 10% by weight, and more preferably 0.2 to 5% by weight, based on the total solid content of the photopolymerizable light sensitive layer composition.

When an argon laser (488 nm) or an SHG-YAG laser (532 nm) is used as a light source for exposure, violet pigment or blue pigment is preferably used in view of the above absorption wavelength relationship or image visibility after the exposure. Such pigment examples include Cobalt Blue, cerulean blue, alkali blue lake, Victria Blue lake, metal free phthalocyanine, Phthalocyanine Blue, Fast Sky Blue, Indanthrene Blue, indigo, dioxane violet, isoviolanthrone violet, Indanthrone Blue, and Indanthrene BC. Among these, Phthalocyanine Blue and dioxane violet are preferred.

The above composition can contain other additives such as a surfactant as a coatability improving agent, or an inorganic filler or a plasticizer for improving a physical property of the photopolymerizable light sensitive layer, as long as performance of the invention is not jeopardized. The surfactant is preferably a fluorine-contained surfactant.

Examples of the plasticizer include dioctyl phthalate, dimethyl phthalate or tricresyl phosphate. The content of the other additives is preferably not more than 10% by weight, based on the total solid content of the composition.

The light sensitive planographic printing plate precursor of the invention is obtained by preparing a coating liquid in which the photopolymerizable light sensitive composition is dissolved in a solvent, coating the coating liquid on a support described later to form a photopolymerizable light sensitive layer on the support.

The thickness of the photopolymerizable light sensitive layer is preferably from 0.3 to 10 g/m$^2$, and more preferably from 0.6 to 6 g/m$^2$.

The solvents used in the preparation of the coating liquid for the photopolymerizable light sensitive layer in the invention include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

The prepared coating liquid for the photopolymerizable light sensitive layer is coated on the support according to a conventional method, and dried to obtain a light sensitive planographic printing plate precursor. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A low drying temperature of the coated photopolymerizable light sensitive layer cannot provide sufficient printing durability, while too a high drying temperature of the coated photopolymerizable light sensitive layer results in marangoni and produces fog at non-image portions. The drying temperature is preferably from 60 to 160° C., more preferably from 80 to 140° C., and still more preferably from 90 to 120° C.

A protective layer is preferably provided on the photopolymerizable light sensitive layer of the light sensitive planographic printing plate precursor of the invention. It is preferred that the protective layer (oxygen shielding layer) is highly soluble in a developer (generally an alkaline solution) described later. Polyvinyl alcohol or polyvinyl pyrrolidone is preferably used in the protective layer. Polyvinyl alcohol has the effect of preventing oxygen from transmitting and polyvinyl pyrrolidone has the effect of increasing adhesion between the oxygen shielding layer and the photopolymerizable light sensitive layer adjacent thereto.

Besides the above two polymers, the oxygen shielding layer may contain a water soluble polymer such as polysaccharide, polyethylene glycol, gelatin, glue, casein, hydroxyethyl cellulose, carboxymethyl cellulose, methyl cellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide.

In the light sensitive planographic printing plate precursor of the invention, adhesive strength between the oxygen shielding layer and the photopolymerizable light sensitive layer is preferably not less than 35 mN/mm, and more preferably not less than 75 mN/mm. Preferred composition of the protective layer is disclosed in Japanese Patent O.P.I. Publication No. 10-10742.

The adhesive strength in the invention can be measured according to the following procedure.

When an adhesive tape with sufficient adhesive strength having a predetermined width is adhered onto the oxygen shielding layer, and then peeled at an angle of 90° to the plane of the light sensitive planographic printing plate precursor, strength necessary to peel the oxygen shielding layer from the photopolymerizable light sensitive layer is measured as the adhesive strength.

The protective layer may further contain a surfactant or a matting agent. The protective layer is formed, coating on the photopolymerizable light sensitive layer a coating liquid in which the above protective layer composition is dissolved in an appropriate coating solvent, and drying. The main solvent of the coating solvent is preferably water or an alcohol solvent such as methanol, ethanol, or iso-propanol.

The thickness of the protective layer is preferably 0.1 to 5.0 μm, and more preferably 0.5 to 3.0 μm.

A support used in the light sensitive planographic printing plate precursor of the invention has a hydrophilic surface.

Examples of the support include a plate of a metal such as aluminum, stainless steel, chromium, or nickel, a plastic film such as a polyester film, a polyethylene film or a polypropylene film which is deposited or laminated with the above-described metal, and a polyester film, a polyvinyl chloride film or a nylon film whose surface is subjected to hydrophilization treatment. Among the above, the aluminum plate is preferably used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable. The brushing roughening method is carried out by rubbing the surface of the support with a rotating brush with a brush hair with a diameter of 0.2 to 0.8 mm, while supplying slurry in which volcanic ash particles with a particle size of 10 to 100 μm are dispersed in water to the surface of the support. The honing roughening method is carried out by ejecting obliquely slurry with pressure applied from nozzles to the surface of the support, the slurry containing volcanic ash particles with a particle size of 10 to 100 μm dispersed in water. A surface roughening can be also carried out by laminating a support surface with a sheet on the surface of which abrading particles with a particle size of from 10 to 100 μm was coated at intervals of 100 to 200 μm and at a density of $2.5 \times 10^3$ to $10 \times 10^3/cm^2$, and applying pressure to the sheet to transfer the roughened pattern of the sheet and roughen the surface of the support.

After the support has been roughened mechanically, it is preferably dipped in an acid or an aqueous alkali solution in order to remove abrasives and aluminum dust, etc. which have been embedded in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, an aqueous alkali solution of for example, sodium hydroxide is preferably used. The dissolution amount of aluminum in the support surface is preferably 0.5 to 5 $g/m^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

Though there is no restriction for the electrolytic surface roughening method, a method in which the support is electrolytically surface roughened in an acidic electrolytic solution. Though an acidic electrolytic solution generally used for the electrolytic surface roughening can be used, it is preferable to use an electrolytic solution of hydrochloric acid or that of nitric acid. The electrolytic surface roughening method disclosed in Japanese Patent Publication No. 48-28123, British Patent No. 896,563 and Japanese Patent O.P.I. Publication No. 53-67507 can be used. In the electrolytic surface roughening method, voltage applied is generally from 1 to 50 V, and preferably from 10 to 30 V. The current density used can be selected from the range from 10 to 200 $A/dm^2$, and is preferably from 50 to 150 $A/dm^2$. The quantity of electricity can be selected from the range of from 100 to 5000 $C/dm^2$, and is preferably 100 to 2000 $C/dm^2$. The temperature during the electrolytically surface roughening may be in the range of from 10 to 50° C., and is preferably from 15 to 45° C.

When the support is electrolytically surface roughened by using an electrolytic solution of nitric acid, voltage applied is generally from 1 to 50 V, and preferably from 5 to 30 V. The current density used can be selected from the range from 10 to 200 A/dm$^2$, and is preferably from 20 to 100 A/dm$^2$. The quantity of electricity can be selected from the range of from 100 to 5000 C/dm$^2$, and is preferably 100 to 2000 C/dm$^2$. The temperature during the electrolytically surface roughening may be in the range of from 10 to 50° C., and is preferably from 15 to 45° C. The nitric acid concentration in the electrolytic solution is preferably from 0.1% by weight to 5% by weight. It is possible to optionally add, to the electrolytic solution, nitrates, chlorides, amines, aldehydes, phosphoric acid, chromic acid, boric acid, acetic acid or oxalic acid.

When the support is electrolytically surface roughened by using an electrolytic solution of hydrochloric acid, voltage applied is generally from 1 to 50 V, and preferably from 2 to 30 V. The current density used can be selected from the range from 10 to 200 A/dm$^2$, and is preferably from 50 to 150 A/dm$^2$. The quantity of electricity can be selected from the range of from 100 to 5000 C/dm$^2$, and is preferably 100 to 2000 C/dm$^2$. The temperature during the electrolytically surface roughening may be in the range of from 10 to 50° C., and is preferably from 15 to 45° C. The hydrochloric acid concentration in the electrolytic solution is preferably from 0.1% by weight to 5% by weight.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 g/m$^2$. After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support. For the anodizing treatment there is preferably used a method of applying a current density of from 1 to 10 A/dm$^2$ to an aqueous solution containing sulfuric acid and/or phosphoric acid in a concentration of from 10 to 50%, as an electrolytic solution. However, it is also possible to use a method of applying a high current density to sulfuric acid as described in U.S. Pat. No. 1,412,768, a method to electrolytically etching the support in phosphoric acid as described in U.S. Pat. No. 3,511,661, or a method of employing a solution containing two or more kinds of chromic acid, oxalic acid, malonic acid, etc. The coated amount of the formed anodization film is suitably 1 to 50 mg/dm$^2$, and preferably 10 to 40 mg/dm$^2$. The coated amount of the formed anodization film can be obtained from the weight difference between the aluminum plates before and after dissolution of the anodization film. The anodization film of the aluminum plate is dissolved employing for example, an aqueous phosphoric acid chromic acid solution which is prepared by dissolving 35 ml of 85% by weight phosphoric acid and 20 g of chromium (IV) oxide in 1 liter of water.

The support which has been subjected to anodizing treatment is optionally subjected to sealing treatment. For the sealing treatment, it is possible to use known methods using hot water, boiling water, steam, a sodium silicate solution, an aqueous dicromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye, an amine salt; and so on. The sol-gel treatment support, which has a functional group capable of causing addition reaction by radicals as a covalent bond, is suitably used.

A method of forming an image on the light sensitive planographic printing plate precursor of the invention comprises imagewise exposing the light sensitive planographic printing plate precursor described above, and developing the exposed plate with a developer described later.

The light sources for forming an image on the light sensitive planographic printing plate precursor of the invention include, for example, a laser, an emission diode, a xenon flush lamp, a halogen lamp, a carbon arc light, a metal halide lamp, a tungsten lamp, a high pressure mercury lamp, and a non-electrode light source.

When the light sensitive planographic printing plate precursor is imagewise exposed at one time, a mask material having a negative image pattern made of a light shielding material is put on the plate to be in close contact with the plate, and exposure is carried out through the mask.

When an array light such as an emission diode array is used or exposure using a halogen lamp, a metal halide lamp or a tungsten lamp is controlled using an optical shutter material such as liquid crystal or PLZT, a digital exposure according to an image signal is possible and preferable. In this case, direct writing is possible without using any mask material.

When a laser is used for exposure, which can be condensed in the beam form, scanning exposure according to an image can be carried out, and direct writing is possible without using any mask material. When the laser is employed for imagewise exposure, a highly dissolved image can be obtained, since it is easy to condense its exposure spot in minute size.

As the laser, argon laser, He—Ne gas laser, YAG laser or semi-conductor laser is preferably used. In the invention, a semiconductor laser employing a InGaN type material, which can continuously emit light with a wavelength of from 380 to 430 nm, are especially preferably used in markedly exhibiting the effects of the invention.

A laser scanning method by means of a laser beam includes a method of scanning on an outer surface of a cylinder, a method of scanning on an inner surface of a cylinder and a method of scanning on a plane. In the method of scanning on an outer surface of a cylinder, laser beam exposure is conducted while a drum around which a recording material is wound is rotated, in which main scanning is represented by the rotation of the drum, while sub-scanning is represented by the movement of the laser beam. In the method of scanning on an inner surface of a cylinder, a recording material is fixed on the inner surface of a drum, a laser beam is emitted from the inside, and main scanning is carried out in the circumferential direction by rotating a part of or an entire part of an optical system, while sub-scanning is carried out in the axial direction by moving straight a part of or an entire part of the optical system in parallel with a shaft of the drum. In the method of scanning on a plane, main scanning by means of a laser beam is carried out through a combination of a polygon mirror, a galvano mirror and an Fθ lens, and sub-scanning is carried out by moving a recording medium. The method of scanning on an outer surface of a cylinder and the method of scanning on an inner surface of a cylinder are more suitable for high density recording because they make it easy to enhance a precision of an optical system.

In the invention, the exposed light sensitive planographic printing plate precursor is preferably subjected to heat treatment before or during development. Such a heat treatment can improve adhesion between the support and the light sensitive photopolymerizable layer, and enhance the advantageous effects of the invention.

Regarding heat treatment, there is, for example, a developing machine in which a preheating roller for preheating an exposed planographic printing plate precursor to a predetermined temperature is arranged upstream a development section where the preheating is carried out before development. The preheating roller is a roller comprised of a pair of rollers, at least one of the pair of the rollers having a heating means within the roller. The roller having a heating means in it is a pipe of a metal with high thermal conductivity such as aluminum or iron, the pipe having a nichrome wire as a heating element. The outside surface of the pipe may be covered with a sheet of a plastic such as polyethylene, polystyrene or Teflon. Details of such a preheating roller can refer to Japanese Patent O.P.I. Publication No. 64-80962.

In the invention, it is preferred that the preheating is carried out at 70 to 180° C. for 3 to 120 seconds.

The light sensitive planographic printing plate precursor used in the invention is subjected to imagewise exposure to harden the exposed portions of the photopolymerizable light sensitive layer, and subjected to developing treatment employing an alkaline developing solution to remove unexposed portions of the layer, whereby an image is formed. As the developer, a conventional alkali developer can be used. Examples of the developing solution include an alkali developing solution containing inorganic alkali agents such as sodium silicate, potassium silicate, ammonium silicate, sodium secondary phosphate, potassium secondary phosphate, ammonium secondary phosphate, sodium bicarbonate, potassium bicarbonate, ammonium bicarbonate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide, and lithium hydroxide.

The developing solution may contain organic alkali agents such as monomethylamine, dimethylamine, trimethylamine, monoethylamine, diethylamine, triethylamine, monoisopropylamine, diisopropylamine, butylamine, monoethanolamine, diethanolamine, triethanolamine, monoisopropanolamine, diisopropanolamine, ethyleneimine, ethylenediamine, and pyridine.

These alkali agents can be used singly or in combination of two or more kinds thereof. The developing solution may optionally contain a surfactant such as an anionic surfactant, an amphoteric surfactant or alcohol.

The developer in the invention is preferably an aqueous solution, which has a silicate concentration of 1.0% by weight in terms of $SiO_2$, and has a pH of from 8.5 to 12.5. The aqueous solution may contain other additives. It is preferred that the aqueous solution further contains a surfactant in an amount of from 0.1 to 5.0% by weight. It is also preferred that the aqueous solution further contains the components described in the developing solution above.

EXAMPLES

Next, synthetic examples, manufacturing examples of support, and examples will be shown below, but the present invention is not limited thereto. In the examples, "parts" represents "parts by weight", unless otherwise specified.

Example 1

<<Synthesis of Polymer Binder, Acryl Copolymer 1>>

Thirty parts of methacrylic acid, 50 parts of methyl methacrylate, 10 parts of acrylonitrile, 10 parts of ethyl methacrylate, 500 parts of ethanol, and 3 parts of α,α-azobisisobutylonitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylbenzylammonium chloride and 25 parts of glycidyl methacrylate were further added to the mixture, and reacted for additional 3 hours. Thus, acryl copolymer 1 was obtained. The weight average molecular weight of the acryl copolymer 1 was 35,000, measured according to GPC. The glass transition temperature Tg of the acryl copolymer 1 was 85° C., measured according to DSC (differential thermal analysis). The mixture was heated to 160° C. for 3 hours to obtain a solid. The solid content of the mixture was 20% by weight, which was obtained from the weight of the resulting solid.

<<Preparation of Light Sensitive Planographic Printing Plate Precursor Sample>>

(Preparation of Support)

A 0.24 mm thick aluminum plate (material 1050, quality H16) was degreased at 60° C. for one minute in a 5% sodium hydroxide solution, washed with water, immersed at 25° C. for one minute in a 10% hydrochloric acid solution to neutralize, and then washed with water. The resulting aluminum plate was electrolytically etched using an alternating current at 25° C. for 60 seconds at a current density of 100 A/dm$^2$ in a 0.3 weight % nitric acid solution, and desmutted at 60° C. for 10 seconds in a 5% sodium hydroxide solution. The desmutted aluminum plate was anodized at 25° C. for 1 minute at a current density of 10 A/dm$^2$ and at a voltage of 15 V in a 15% sulfuric acid solution, and subjected to hydrophilic treatment at 75° C., employing a 1% polyvinyl phosphonic acid aqueous solution. Thus, support was obtained. The center line average surface roughness (Ra) of the support was 0.65 μm.

(Preparation of Subbed Support)

The following subbing layer coating liquid was coated on the support obtained above using a wire bar, dried at 90° C. for one minute, and further heated at 110° C. for 3 minutes to give a subbing layer with a dry thickness of 0.1 g/m$^2$. Thus, a subbed support was obtained.

| <Subbing layer coating liquid> | |
| --- | --- |
| γ-Methacryloxypropyltrimethoxysilane | 1 part |
| Methyl ethyl ketone | 80 parts |
| Cyclohexanone | 19 parts |

The following photopolymerizable light sensitive layer coating liquid 1 was coated on the subbed support using a wire bar, and dried at 95° C. for 1.5 minutes to give a photopolymerizable light sensitive layer with a dry thickness of 1.4 g/m$^2$. After that, the following oxygen shielding layer coating liquid was coated on the photopolymerizable light sensitive layer using an applicator, and dried at 75° C. for 1.5 minutes to give an oxygen shielding layer with a dry thickness of 1.8 g/m$^2$. Thus, light sensitive planographic printing plate precursor samples 1 through 15 were prepared.

| (Photopolymerizable light sensitive layer coating liquid 1) | |
|---|---|
| Acryl copolymer 1 | 40.0 parts |
| Spectral sensitizing dye 1 | 1.0 part |
| Spectral sensitizing dye 2 | 1.0 part |
| IRGACURE 784 (produced by Ciba Specialty Chemicals Co.) | 4.0 parts |
| N-phenylglycine benzyl ester | 4.0 parts |
| Triazine (as shown in Table 1) | 1.0 part |
| Addition polymerizable ethylenically unsaturated bond-containing monomer (as shown in Table 1) | 20.0 parts |
| NK OLIGOU-4HA (Urethane tipe monomer produced by Shinnakamura Chemical Co., Ltd.) | 10.0 parts |
| NK ESTER-4G (Tetraethylene glycol dimethacrylate produced by Shinnakamura Chemical Co., Ltd.) | 10.0 parts |
| Phthalocyanine pigment (MHI 454 produced by Mikuni Sikisosha) | 6.0 parts |
| 2-t-Butyl-t-(3-t-butyl-2-hydroxy-5-methylbenzyl)-4-methylphenyl acrylate (Sumirizer GS produced by Sumitomo 3M Co., Ltd.) | 0.5 parts |
| Fluorine-contained surfactant (FC-178K produced by Dainippon ink Kagaku Kogyo Co., Ltd.) | 0.5 parts |
| Methyl ethyl ketone | 80 parts |
| Cyclohexanone | 820 parts |

Spectral sensitizing dye 1

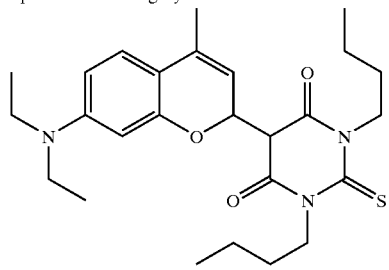

Spectral sensitizing dye 2

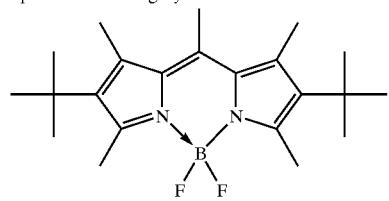

| <Oxygen shielding layer coating liquid> | |
|---|---|
| Polyvinyl alcohol (GL-05, produced by Nippon Gosel Kagaku Co., Ltd.) | 89 parts |
| Water soluble polyamide (P-70, produced by Toray Co., Ltd.) | 10 parts |
| Surfactant (Surfinol 465, produced by Nisshin Kagaku Kogyo Co., Ltd.) | 0.5 parts |
| Water | 900 parts |

<<Evaluation of Light Sensitive Planographic Printing Plate Precursor Sample>>

Sensitivity

The light sensitive planographic printing plate precursor sample obtained above was imagewise exposed at a resolving degree of 2400 dpi, employing a plate setter Tiger Cat (produced by ECRM Co., Ltd.) equipped with a light source emitting light with a wavelength of 532 nm. Herein, dpi represents the dot numbers per 2.54 cm. The image pattern used for exposure comprised a solid image and a square dot image with a screen number of 175 LPI and a 50% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample at 105° C. for 10 seconds, a pre-washing section for removing the oxygen shielding layer before development, a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, planographic printing plate samples 1 through 13 were obtained.

The lowest exposure energy amount ($\mu J/cm^2$) capable of reproducing the solid image above in the resulting planographic printing plate without reduction of the layer thickness at image portions was defined as sensitivity 1. The less the lowest exposure energy amount ($\mu J/cm^2$) is, the higher the sensitivity.

| <Composition of developer> | |
|---|---|
| Potassium silicate A (an aqueous potassium silicate solution containing 25.5–27.5% by weight of $SiO_2$ and 12.5–14.5% by weight of $K_2O$) | 8.0% by weight |
| NEWCOL B-13 (produced by Nippon Nyukazai Co., Ltd.) | 3.0% by weight |
| Potassium hydroxide | Amount giving pH 12.3 |

Storage Stability (Sensitivity Stability)

The light sensitive planographic printing plate precursor sample obtained above was packaged in a light shielding and moisture-proofing package. The resulting package was stored at 55° C. for 8 hours, then cooled to 5° C. and stored at that temperature for 16 hours. This operation was repeated three times. Sensitivity of the resulting sample was measured in the same manner as above as sensitivity 2. Sensitivity difference {Sensitivity 2-Sensitivity 1 ($\mu J/cm^2$)} was calculated as an evaluation measure of storage stability. The less sensitivity difference shows more excellent storage stability.

Printing Durability

The above obtained light sensitive planographic printing plate sample was exposed through an original with a screen line number of 175 at an optimal exposure amount, and developed in the same manner as above to obtain a planographic printing plate. Employing the resulting printing plate, printing was carried out on a press (DAIYA1F-1 produced by Mitsubishi Jukogyo Co., Ltd.), wherein a coat paper, printing ink (soybean oil-based ink "Naturalist 100" produced by Dainippon Ink Kagaku Kogyo Co., Ltd.), and dampening water (SG-51, H solution produced by Tokyo Ink Co., Ltd., Concentration: 1.5%) were used. The number of prints printed from the beginning of the printing till when dot reduction at highlight image portions was observed was counted as an evaluation measure of storage stability.

The results are shown in Table 1.

TABLE 1

| Sample No. | Monomer | Triazine compound | Sensitivity 1 ($\mu J/cm^2$) | Sensitivity 2 ($\mu J/cm^2$) | Storage stability ($\mu J/cm^2$) | Printing Durability (print number) | Remarks |
|---|---|---|---|---|---|---|---|
| 1 | M-1 | TA-7 | 80 | 90 | 10 | ≧300,000 | Inv. |
| 2 | M-2 | TA-7 | 80 | 100 | 20 | ≧300,000 | Inv. |
| 3 | M-3 | TA-7 | 120 | 130 | 10 | ≧300,000 | Inv. |
| 4 | M-4 | TA-7 | 80 | 110 | 30 | ≧300,000 | Inv. |
| 5 | M-6 | TA-7 | 60 | 80 | 20 | ≧300,000 | Inv. |
| 6 | N-6 | TA-7 | 100 | 100 | 0 | ≧300,000 | Inv. |
| 7 | M-7 | TA-7 | 120 | 130 | 10 | ≧300,000 | Inv. |
| 8 | M-2 | TB-12 | 90 | 100 | 10 | ≧300,000 | Inv. |
| 9 | M-3 | TB-12 | 120 | 130 | 10 | ≧300,000 | Inv. |
| 10 | M-4 | TB-12 | 90 | 110 | 20 | ≧300,000 | Inv. |
| 11 | M-2 | None | 120 | 150 | 30 | 250,000 | Inv. |
| 12 | M-3 | None | 150 | 180 | 30 | 250,000 | Inv. |
| 13 | M-4 | None | 120 | 160 | 40 | 250,000 | Inv. |
| 14 | *Monomer A | TA-7 | 180 | 260 | 80 | 170,000 | Comp. |
| 15 | *Monomer A | None | 250 | 400 | 150 | 140,000 | Comp. |

Inv.: Invention,
Comp.: Comparative,
*Monomer A: A reaction product of ethyl diethanol amine (1 mol), hexamethylene diisocyanate (2 mol), and MH-2 (2 mol)

As is apparent from Table 2 above, inventive samples comprising the addition polymerizable ethylenically double bond-containing monomer falling within the scope of the invention provide high sensitivity to 532 nm light, high storage stability and high printing durability as compared with comparative samples.

Example 2

Light sensitive planographic printing plate precursor samples 21 through 27 were prepared in the same manner as in Example 1 above, except that the following photopolymerizable light sensitive layer coating liquid 2 was used instead of the photopolymerizable light sensitive layer coating liquid 1

| (Photopolymerizable light sensitive layer coating liquid 2) | |
|---|---|
| Acryl copolymer 1 | 40.0 parts |
| Spectral sensitizing dye 3 | 1.0 part |
| Spectral sensitizing dye 4 | 1.0 part |
| Spectral sensitizing dye 5 | 1.0 part |
| Tetrabutylammonium butyl trinaphthyl Borate | 4.0 parts |
| Triazine (as shown in Table 2) | 1.0 part |
| Addition polymerizable ethylenically unsaturated bond-containing monomer (as shown in Table 2) | 20.0 parts |
| NK OLICOU-4HA (produced by Shinnakamura Chemical Co., Ltd.) | 10.0 parts |
| NK ESTER-4G (produced by Shinnakamura Chemical Co., Ltd.) | 10.0 parts |
| Phthalocyanine pigment (MHI 454 produced by Mikuni Sikisosha) | 6.0 parts |
| 2-t-Butyl-6-(3-t-butyl-2-hydroxy-5-methylbenzyl)-4-methylphenyl acrylate (Sumirizer GS produced by Sumitomo 3M Co., Ltd.) | 0.5 parts |
| Fluorine-contained surfactant (FC-178K produced by Dainippon ink Kagaku Kogyo Co., Ltd.) | 0.5 parts |
| Methyl ethyl ketone | 80 parts |
| Cyclohexanone | 820 parts |

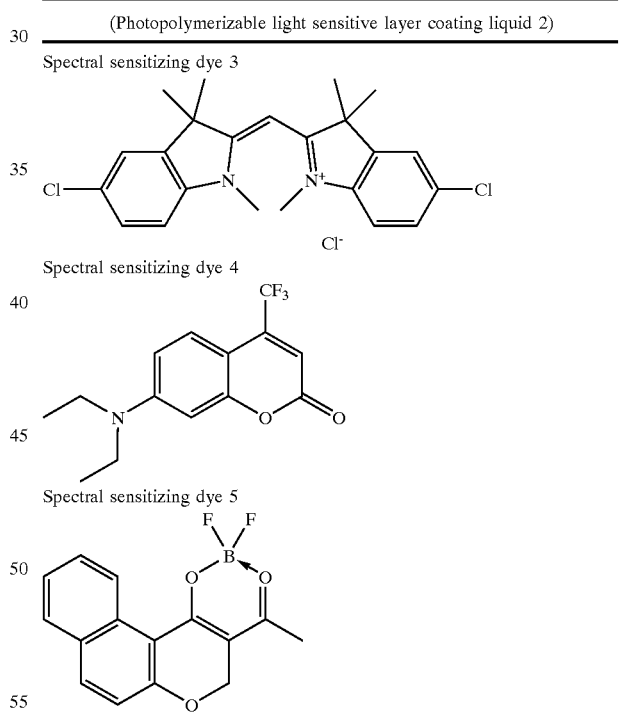

-continued (Photopolymerizable light sensitive layer coating liquid 2)

Spectral sensitizing dye 3

Spectral sensitizing dye 4

Spectral sensitizing dye 5

<<Evaluation of Light Sensitive Planographic Printing Plate Precursor Samples 21-27>>

The light sensitive planographic printing plate precursor sample obtained above was imagewise exposed at a resolving degree of 2400 dpi, employing a modified plate setter of a plate setter Tiger Cat (produced by ECRM Co., Ltd.) equipped with a laser with an output power of 30 mW emitting light with a wavelength of 408 nm. Subsequently, the exposed sample was processed and evaluated for sensitivity, storage stability and printing durability in the same manner as in Example 1.

The results are shown in Table 2.

TABLE 2

| Sample No. | Monomer | Triazine compound | Sensitivity 1 ($\mu J/cm^2$) | Sensitivity 2 ($\mu J/cm^2$) | Storage stability ($\mu J/cm^2$) | Printing Durability (print number) | Remarks |
|---|---|---|---|---|---|---|---|
| 21 | M-2 | TA-7 | 30 | 35 | 5 | $\geq$300,000 | Inv. |
| 22 | M-3 | TA-7 | 30 | 35 | 5 | $\geq$300,000 | Inv. |
| 23 | M-4 | TA-7 | 40 | 40 | 0 | $\geq$300,000 | Inv. |
| 24 | M-3 | TA-12 | 25 | 30 | 5 | $\geq$300,000 | Inv. |
| 25 | M-4 | TA-12 | 30 | 35 | 5 | $\geq$300,000 | Inv. |
| 26 | M-4 | TA-12 | 35 | 40 | 5 | $\geq$300,000 | Inv. |
| 27 | *Monomer A | TA-7 | 40 | 65 | 25 | 150,000 | Comp. |

Inv.: Invention,
Comp.: Comparative,
*Monomer A: A reaction product of ethyl diethanol amine (1 mol), hexamethylene diisocyanate (2 mol), and MH-2 (2 mol)

As is apparent from Table 2 above, inventive samples comprising the addition polymerizable ethylenically double bond-containing monomer falling within the scope of the invention provide high sensitivity to 408 nm light, high storage stability and high printing durability as compared with comparative samples.

EFFECT OF THE INVENTION

The present invention provides a light sensitive composition and a light sensitive planographic printing plate precursor, each providing high sensitivity, high storage stability, and high printing durability.

What is claimed is:

1. A light sensitive composition containing A) an addition polymerizable ethylenically double bond-containing monomer, B) a photopolymerization initiator, and C) a polymer binder having an acid value of 10 to 150, wherein the addition polymerizable ethylenically double bond-containing monomer is a reaction product of a tertiary amine having two or more hydroxyl groups in the molecule, a diisocyanate having an aromatic ring in the molecule and a compound having a hydroxyl group and an addition polymerizable ethylenically double bond in the molecule.

2. The light sensitive composition of claim 1, wherein the photopolymerization initiator is a polyhalogenated methyl group-containing triazine compound.

3. The light sensitive composition of claim 1, wherein the tertiary amine has a hydroxyl group of from 2 to 6 in the molecule.

4. The light sensitive composition of claim 1, wherein the polymer binder is a copolymer of a carboxyl group-containing monomer and an alkyl methacrylate or alkyl acrylate.

5. The light sensitive composition of claim 4, wherein the carboxyl group-containing monomer is acrylic acid or methacrylic acid.

6. The light sensitive composition of claim 1, wherein the composition contains the addition polymerizable ethylenically double bond-containing monomer in an amount of 3 to 80% by weight and the polymer binder in an amount of 10 to 90% by weight, based on the solid content of the light sensitive composition.

7. The light sensitive composition of claim 1, wherein the composition contains the addition polymerizable ethylenically double bond-containing monomer in an amount of 5 to 60% by weight and the polymer binder in an amount of 15 to 70% by weight, based on the solid content of the light sensitive composition.

8. A light sensitive planographic printing plate precursor comprising a support and provided thereon, a photopolymerizable light sensitive layer containing A) an addition polymerizable ethylenically double bond-containing monomer, B) a photopolymerization initiator, and C) a polymer binder having an acid value of 10 to 150, wherein the addition polymerizable ethylenically double bond-containing monomer is a reaction product of a tertiary amine having two or more hydroxyl groups in the molecule, a diisocyanate having an aromatic ring in the molecule and a compound having a hydroxyl group and an addition polymerizable ethylenically double bond in the molecule.

9. The light sensitive planographic printing plate precursor of claim 8, wherein the photopolymerization initiator is a polyhalogenated methyl group-containing triazine compound.

10. The light sensitive planographic printing plate precursor of claim 8, wherein the tertiary amine has a hydroxyl group of from 2 to 6 in the molecule.

11. The light sensitive planographic printing plate precursor of claim 8, wherein the polymer binder is a copolymer of a carboxyl group-containing monomer and an alkyl methacrylate or alkyl acrylate.

12. The light sensitive planographic printing plate precursor of claim 8, wherein the carboxyl group-containing monomer is acrylic acid or methacrylic acid.

* * * * *